US012696734B2

(12) United States Patent (10) Patent No.: US 12,696,734 B2
Krawicz et al. (45) Date of Patent: Jul. 28, 2026

(54) PATTERNING A SEMICONDUCTOR SUBSTRATE

(71) Applicant: Tokyo Electron Limited, Tokyo (JP)

(72) Inventors: Alexandra Krawicz, Albany, NY (US); Steven Grzeskowiak, Albany, NY (US); Eric Chih-Fang Liu, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 700 days.

(21) Appl. No.: 17/888,972

(22) Filed: Aug. 16, 2022

(65) Prior Publication Data

US 2024/0063019 A1 Feb. 22, 2024

(51) Int. Cl.
| | |
|---|---|
| *H10P 76/40* | (2026.01) |
| *G03F 7/004* | (2006.01) |
| *G03F 7/09* | (2006.01) |
| *G03F 7/11* | (2006.01) |
| *G03F 7/20* | (2006.01) |
| *H10P 50/00* | (2026.01) |

(52) U.S. Cl.
CPC .......... *H10P 76/4088* (2026.01); *H10P 50/73* (2026.01); *G03F 7/0042* (2013.01); *G03F 7/094* (2013.01); *G03F 7/11* (2013.01); *G03F 7/2004* (2013.01)

(58) Field of Classification Search
None
See application file for complete search history.

(56) References Cited

U.S. PATENT DOCUMENTS

| | | | | |
|---|---|---|---|---|
| 6,692,903 | B2 * | 2/2004 | Chen ..................... | H10P 70/273 |
| | | | | 430/329 |
| 11,314,168 | B2 | 4/2022 | Tan et al. | |
| 2013/0270227 | A1 * | 10/2013 | Guha ........................ | C23F 1/02 |
| | | | | 156/345.52 |
| 2018/0269119 | A1 * | 9/2018 | Coppa ............... | H01L 21/31116 |
| 2019/0341257 | A1 * | 11/2019 | Raley ............... | H01L 21/31116 |
| 2020/0013620 | A1 | 1/2020 | Fung et al. | |
| 2020/0234957 | A1 | 7/2020 | Mignot et al. | |
| 2020/0272045 | A1 * | 8/2020 | Felix ........................ | G03F 7/094 |
| 2022/0181153 | A1 | 6/2022 | Han et al. | |
| 2022/0293587 | A1 * | 9/2022 | Liao ..................... | G03F 7/0043 |

FOREIGN PATENT DOCUMENTS

CN 114724929 A 7/2022

OTHER PUBLICATIONS

Conti, Giuseppina, et al., "Chemical and structural characterization of EUV photoresists as a function of depth by standing-wave x-ray photoelectron spectroscopy," Journal of Micro/Nanopatterning, Materials and Metrology, 20(3), Jul. 1, 2021, 8 pages.
International Search Report and Written Opinion, PCT Application No. PCT/US2023/028679, mailed Nov. 15, 2023, 11 pages.

* cited by examiner

*Primary Examiner* — Khaja Ahmad
(74) *Attorney, Agent, or Firm* — Slater Matsil, LLP

(57) ABSTRACT

A method of forming a semiconductor device, where the method includes receiving a substrate in a processing chamber, the substrate including a first patterned layer including a metal-based material; and with a gaseous etch process, trimming the first patterned layer to form a second patterned layer, the gaseous etch process including exposing the first patterned layer to an un-ionized gas including a halogen compound.

21 Claims, 9 Drawing Sheets

100

100

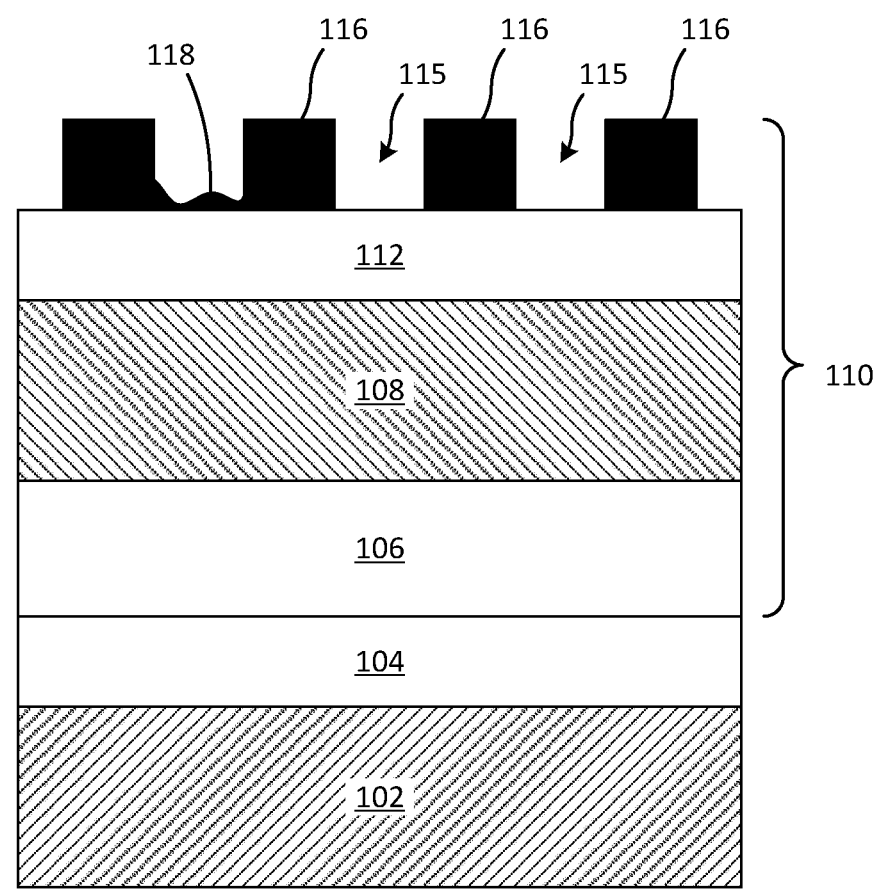
FIGURE 1C

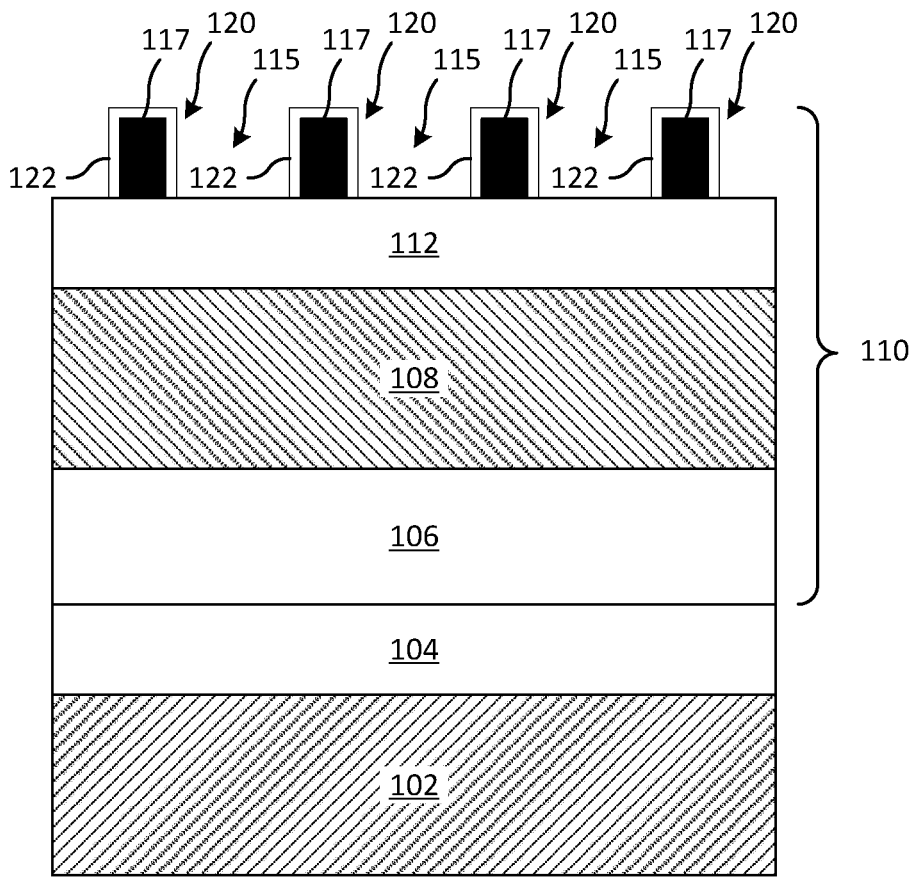
FIGURE 1D

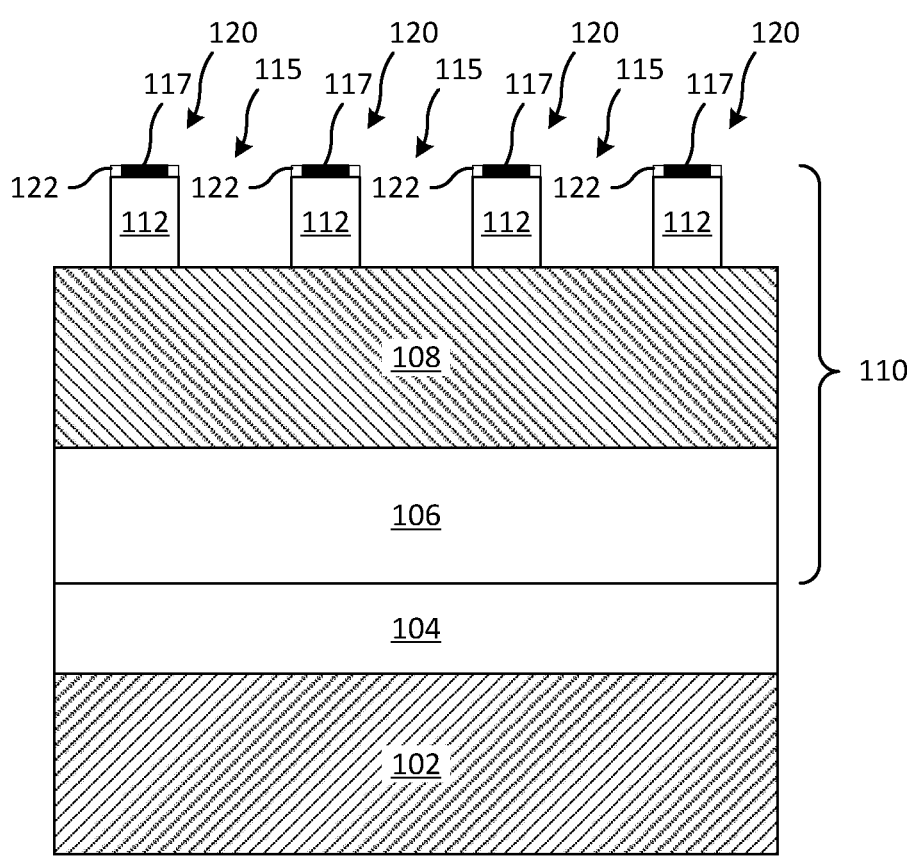
FIGURE 1E

100

100

115    115    115

104    104    104    104

102

200

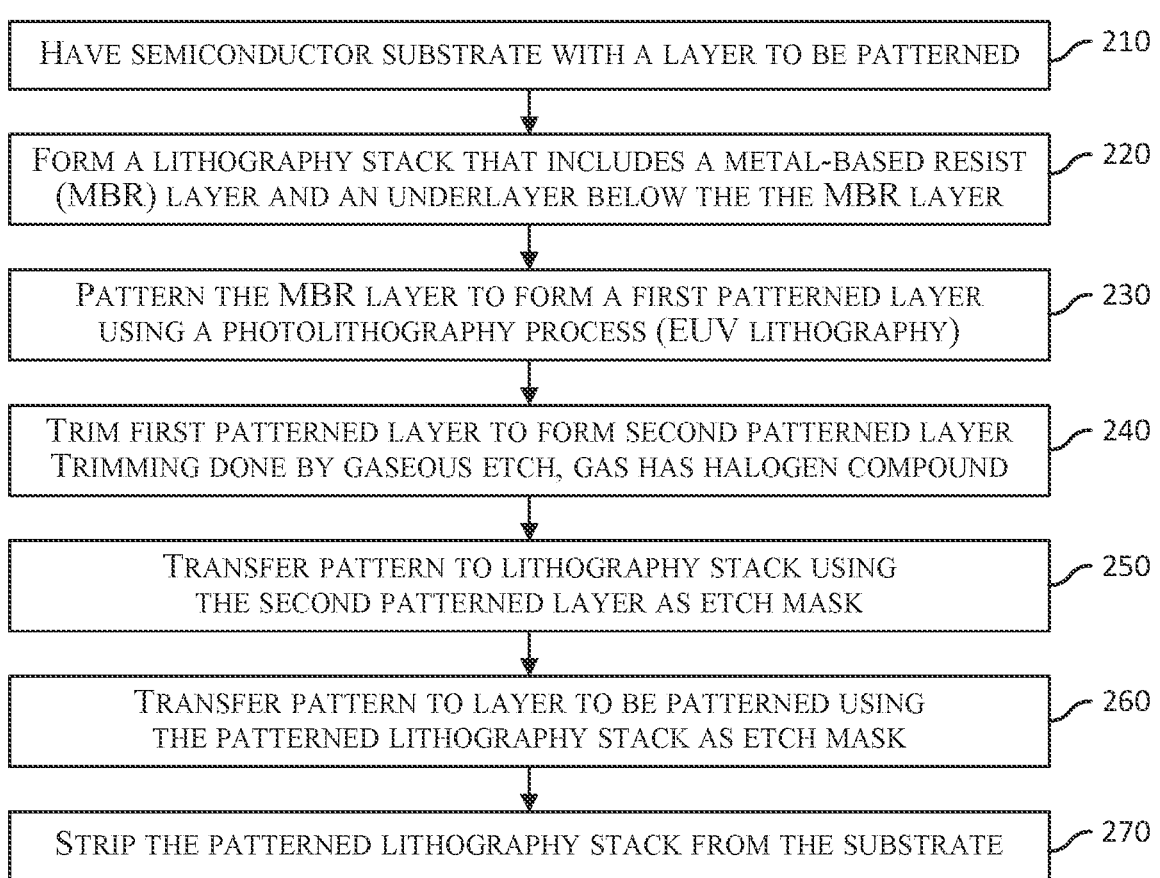

HAVE SEMICONDUCTOR SUBSTRATE WITH A LAYER TO BE PATTERNED — 210

FORM A LITHOGRAPHY STACK THAT INCLUDES A METAL-BASED RESIST (MBR) LAYER AND AN UNDERLAYER BELOW THE THE MBR LAYER — 220

PATTERN THE MBR LAYER TO FORM A FIRST PATTERNED LAYER USING A PHOTOLITHOGRAPHY PROCESS (EUV LITHOGRAPHY) — 230

TRIM FIRST PATTERNED LAYER TO FORM SECOND PATTERNED LAYER TRIMMING DONE BY GASEOUS ETCH, GAS HAS HALOGEN COMPOUND — 240

TRANSFER PATTERN TO LITHOGRAPHY STACK USING THE SECOND PATTERNED LAYER AS ETCH MASK — 250

TRANSFER PATTERN TO LAYER TO BE PATTERNED USING THE PATTERNED LITHOGRAPHY STACK AS ETCH MASK — 260

STRIP THE PATTERNED LITHOGRAPHY STACK FROM THE SUBSTRATE — 270

FIGURE 2

PATTERNING A SEMICONDUCTOR SUBSTRATE

TECHNICAL FIELD

The present invention relates generally to methods for fabricating a semiconductor device, and, in particular embodiments, to patterning a semiconductor substrate.

BACKGROUND

An integrated circuit (IC) is a network of electronic circuit components in a monolithic structure comprising a stack of patterned layers in a semiconductor substrate. The IC is fabricated by processing the substrate through a sequence of patterning levels where, at each level, a layer is deposited and patterned using photolithography techniques. The processing comprises printing a pattern of actinic radiation on a surface coated with photoresist and transferring the printed pattern into a layer further below by using the patterned resist as a mask for the pattern-transfer etch.

At each new technology node, design rules for minimum features are scaled to allow the component packing density to be doubled to lower the unit cost of ICs. Consequently, the number of pattern levels having features with nanoscale dimensions has been increasing steadily. Even if minimum pitch patterns at the 10 nm node are printed using the prevalent 193 nm optics aided by multiple patterning techniques, the higher mask count and masking steps for multiple patterning is a cost limiting factor for further scaling. At the sub-10 nm nodes, critical pattern levels may switch to the shorter wavelength 13.5 nm extreme ultraviolet (EUV) lithography. However, successful deployment of EUV in high volume manufacturing requires not only printing the higher resolution minimum pitch features but also controlling the line edge roughness (LER) and local critical dimension uniformity (LCDU) to less than about 1 nm to 3 nm. Accordingly, innovation in methods for improving LER and LCDU is desired.

SUMMARY

A method of forming a semiconductor device, where the method includes receiving a substrate in a processing chamber, the substrate including a first patterned layer including a metal-based material; and with a gaseous etch process, trimming the first patterned layer to form a second patterned layer, the gaseous etch process including exposing the first patterned layer to an un-ionized gas including a halogen compound.

A method of patterning a semiconductor substrate, where the method includes receiving a substrate in a processing chamber, the substrate including a lithography stack over a layer to be patterned, the stack including a patterned metal based resist (MBR) layer and an underlayer below the MBR layer; and flowing an un-ionized gas over the substrate, the gas including a halogen compound, where flowing the gas causes the MBR layer to chemically react with the halogen compound.

A method of forming a semiconductor device, where the method includes forming a metal-based resist (MBR) layer over a semiconductor substrate; patterning the MBR layer using a photolithography process to form a patterned MBR layer, the patterned MBR layer including a line having a first linewidth; exposing the patterned MBR layer to a flow of an un-ionized gas including a halogen compound to change the linewidth of the line from the first linewidth to a second linewidth, the second linewidth being less than the first linewidth; and after exposing the patterned MBR layer to a flow of an un-ionized gas including a halogen compound, patterning a layer to be patterned, where the patterning the layer to be patterned includes performing a pattern-transfer etch process using the patterned MBR layer as an etch mask.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1G illustrate a method of patterning a semiconductor substrate with cross-sectional views of a semiconductor device at various intermediate stages of fabrication, in accordance with some embodiment;

FIG. 2 illustrates a flowchart of the method of patterning a semiconductor substrate, illustrated in FIGS. 1A-1G.

DETAILED DESCRIPTION OF ILLUSTRATIVE EMBODIMENTS

Figure 1A:
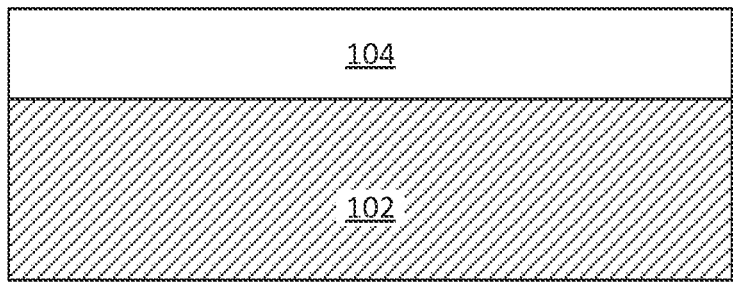

The present invention relates to a method for patterning a layer to be patterned in a semiconductor substrate. A first layer is formed and patterned using photolithography, for example, extreme ultraviolet (EUV) lithography, to form a first patterned layer. Generally, in photolithography a photosensitive (resist) layer is formed over the substrate and exposed to a pattern of actinic radiation. For example, the radiation source for EUV lithography is radiation emitted in a narrow band around 13.5 nm from a laser-produced plasma (LPP) containing tin vaporized with a carbon dioxide laser. The exposed resist is then developed to transfer the radiation pattern to the resist, forming a first patterned layer. In the examples described in this disclosure, the first patterned layer is a metal-based layer, for example, a metal-based resist (MBR) layer. Using the invented method, the first patterned layer is treated to form a second patterned layer. The second patterned layer may be subsequently used as a masking layer in a first pattern-transfer etch to transfer its pattern to a layer of the substrate. Using the embodiments described in this disclosure provides the advantage of forming a pattern in the layer to be patterned in which a feature such as an array of lines designed at the minimum pitch of a sub-10 nm technology node has a low count of bridging and line-break defects and a small line edge roughness (LER) value relative to its linewidth, W.

The term, line, refers to a feature that is shaped like a narrow rectangle in a plan view. An edge of the line refers to any one of the two sides along a length dimension of the rectangle, the length being the longer dimension. A location of the edge, E, is defined here as a distance of the edge from a reference straight line through the center of the feature along the length direction. Ideally, the edge would be perfectly straight, and E would be a constant equal to W/2. In reality, the edge has a roughness, that is, E deviates randomly around an average value, $E_{av}=W/2$, when measured at various locations along its length. The value of LER is a measure of the magnitude of this random variation in the edge location, often expressed as three times the standard deviation of E ($3\sigma_E$). There are similar random variations of an edge of a top opening along the length of a patterned trench that may be quantified by a similarly defined LER value for the trench. Random variations along the perimeter of a patterned hole or a pillar, for example, a contact hole or a silicon pillar, is usually quantified by measuring a local critical dimension uniformity (LCDU) in an array of holes/ pillars, where the critical dimension (CD) is a width of the hole/pillar.

Generally, LER degrades electrical behavior and, in severe cases, may even result in a physical line-break and bridging defects in densely packed features, such as an array of lines drawn at a minimum pitch. For example, undesired leakage current of a transistor increases with increased roughness in a resist line which has been used as an etch mask in patterning a sacrificial gate in a replacement metal gate (RMG) process flow. As another example, consider a patterned resist layer that is used as a mask to etch trenches in an interlayer dielectric (ILD) between adjacent interconnect levels. Typically, rectangular trenches with roughly vertical sidewalls are formed at locations where rectangular openings have been patterned in the resist (assuming positive resist). Subsequently, the trenches are filled with metal and excess metal is etched back to form inlaid metal lines. Random variations of the location of an edge of an opening in the resist layer gets transferred by the etch process to the respective trench sidewall. When the trench is filled with metal, the roughness of the trench sidewall is translated to a linewidth roughness (LWR) of the respective metal interconnect line which, in turn, increases a parasitic resistance and degrades an electromigration lifetime of the metal line. For these and other similar reasons, it is beneficial to use a patterning method that provides the advantage of a small LER, such as the embodiments described in this disclosure.

As mentioned in the background section, minimum feature sizes continue to be scaled to smaller dimensions. Clearly, the smaller the linewidths are in an IC design, the larger is the impact of LER on performance and reliability of the IC. In order to pattern the higher resolution features of the critical patterning levels at the sub-10 nm nodes, 13.5 nm EUV lithography may replace the incumbent 193 nm deep ultraviolet (DUV) lithography. However, controlling LER of EUV resist lines is complicated by stochastic effects associated with the high EUV photon energy.

A 14.3 times higher energy of an EUV photon relative to a 193 nm DUV photon (92 eV vs. 6.4 eV) implies that, for a fixed exposure dose typically used to expose photoresist, say 15 mJ/cm$^2$, the number of photons incident on the resist for EUV is (1/14.3) times that for DUV. The ratio of 1:14.3 refer to average photon counts; the local photon count varies randomly from one location to another. In other words, after resist is exposed to a radiation pattern comprising a line, the number of photons hits in a 1 nm$^2$ spot on the line is a random variable whose value fluctuates with the position of the spot along the length direction. For a mean exposure of 15 mJ/cm$^2$, a 1 nm$^2$ spot receives, on the average, 10 photon hits from exposure to 13.5 nm EUV radiation compared to 143 photon hits for 193 nm DUV radiation. The spatial fluctuation in photon count is equivalent to spatial fluctuation in exposure dose, the dose being the photon count multiplied by the photon energy. The smaller the average number of photons, the larger is the magnitude of the random fluctuations in exposure dose from one location to another relative to the average dose.

Number fluctuation (often referred to as shot noise) is mathematically modeled as a Poisson process, where the mean value ($\mu_n$) of the random number is equal to its variance ($\sigma_n^2$). A percentage variation of a random number is generally defined as $\sigma_n/\mu_n$. For a Poisson process, $\sigma_n/\mu_n = \sqrt{}$ $(\mu_n)^{-1}$. Thus, as expected, resist exposure with EUV radiation has higher spatial variation compared to that for DUV radiation because the ratio of EUV photons to DUV photons is 1:14.3 for equal exposure dose. This means that theoretically, the percentage variation in the local exposure dose is $\sqrt{14.3}$, or, 3.8 times larger for EUV lithography relative to DUV lithography.

Other undesired resist stochastic effects include those related to the random nature of photon absorption and the associated photochemical reactions. For example, the fraction of incident photons that are absorbed in the resist varies randomly with spatial location. Also, the trajectories of a cascade of photoelectrons and secondary electrons that interact with the resist to chemically alter the polymer structure following a photon absorption event are random trajectories, a phenomenon referred to as random walk. Similar to the number fluctuation of incident photons, the impact of these stochastic processes on resist exposure is worse for EUV relative to DUV.

The stochastic effect due to the discreteness of photons is a three-dimensional effect of a finite number of photons absorbed at random locations in a volume of resist. Thus, random spatial variation in resist exposure not only increases the LER of the resist line but also increases the roughness of a top surface of the resist. An uneven top surface implies a randomly varying resist thickness. The scaling trend for resist thickness is toward thinner resist to avoid deformation and even collapse of high aspect ratio resist features, despite the fact that the thinning worsens shot noise by reducing the average number of photons in the resist. Because of the narrow linewidths at the sub-10 nm nodes, the resist thickness may be scaled down to avoid the mechanical instability of high aspect ratio lines. Typically, substrates may be coated with EUV resist having a thickness of about 20 nm to 40 nm, and, in some cases, as low as 15 nm. Reducing the resist thickness reduces the masking ability of the patterned resist layer to mask a subsequent pattern-transfer etch. Thickness fluctuations around the average value further worsens this situation. At certain random locations along the resist lines, the thickness of the resist may be insufficient to mask the etchants for the full duration of the etch, in which case the underlayer would be exposed to the etchants, resulting in a line-break defect.

After the first patterned layer is formed in a developer, the substrate undergoes a treatment that modifies the first patterned layer to form a second patterned layer. A first pattern-transfer etch is performed with the second patterned layer as a masking layer to pattern an underlayer below the resist. Generally, the treatment includes performing an etch step to trim the first patterned layer. The trimming may serve the dual purpose of resist descum and resist linewidth adjustment to a smaller target CD. The trimmed resist is the second patterned layer.

If the descumming etch process involves trimming the resist chemically and/or physically by interactions with high energy particles then the resist material is likely to suffer damage. For example, if a plasma process is used then the resist may be damaged by high energy ions and radicals in the plasma. The damage is manifested as line-break defects and severe LER. The enhanced roughness may be a result of resist notching caused by the high energy particles in the plasma impinging on the surface of the first patterned layer. A damaged resist line with notching along the edges may result in further line-breaks during the first pattern-transfer etch (typically, a plasma etch process) that uses the second patterned layer as the etch mask. Such damage is avoided by using the resist descum/trim process in the embodiments of the invented method, described in further detail below.

In the embodiments in this disclosure, a gaseous etch process with an un-ionized gas is performed to produce the second patterned layer. As explained in further detail below, the gaseous etch process used for the combined descum and trim etch is a chemical surface treatment that removes resist residue and reduces resist linewidth without damaging the resist pattern. As mentioned above, the first pattern-transfer etch uses the second patterned layer (the layer after trimming the first patterned layer) as the etch mask.

The term un-ionized gas does not imply that the gas is totally devoid of ions. It is understood that a very low ion density consistent with the ambient temperature would be present. In this disclosure, un-ionized gas refers to a gaseous state that is not a gas discharge plasma, where the gas is in a weakly ionized state with an ion density that is many orders of magnitude higher than the thermal equilibrium density of ions in the respective un-ionized gas.

The resist trim/descum gaseous etch with an un-ionized gas is utilized in a process flow for a method of patterning a semiconductor substrate. The processing is described with reference to FIGS. 1A to 1G, and a flowchart of the method is illustrated in FIG. 2.

FIG. 1A illustrates a cross-sectional view of a semiconductor device 100 comprising a semiconductor substrate 102 having a layer to be patterned 104 formed on the semiconductor substrate 102. For the sake of specificity, in this example, the layer to be-patterned 104 is a titanium nitride (TiN) layer. In general, the layer to be patterned may be a dielectric layer (e.g., silicon oxide, silicon nitride, and carbon-doped oxide (CDO)), a metallic layer (e.g., aluminum, titanium, and titanium nitride), or a semiconductor layer (e.g., amorphous silicon). The semiconductor substrate 102 may be a combination of various semiconductor, dielectric, and metallic layers fabricated over a starting substrate. The starting substrate may comprise elemental semiconductors (e.g., Si and Ge), compound semiconductors (e.g., GaAs, GaN, InAs, InP, CdS, and ZnO), semiconductor alloys (e.g., $Ga_xAs_{1-x}$, $Ga_xAl_{1-x}N$, and $Si_xGe_{1-x}$), silicon-on-insulator (SOI), and the like.

Figure 1B:
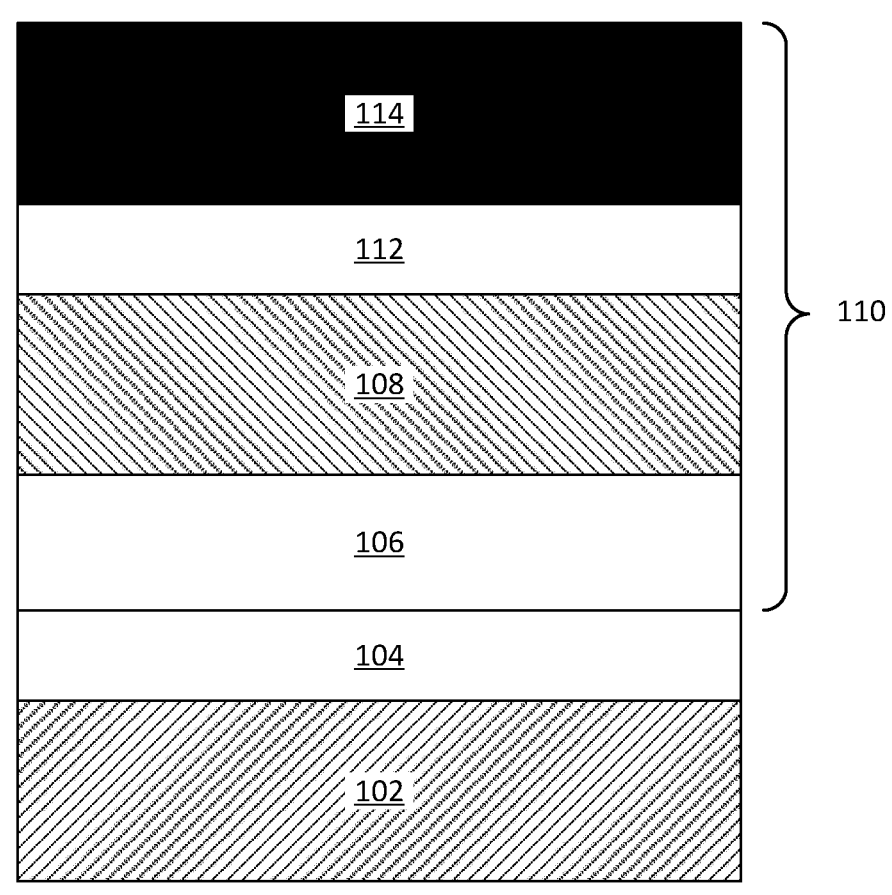

In FIG. 1B, a lithography stack 110 has been formed over the layer to be patterned 104. Generally, the lithography stack comprises sacrificial layers. A first layer 114 at the top of the lithography stack 110 comprises a metal-based material. In the example embodiments in this disclosure, the first layer 114 is an MBR layer. In some embodiment, the first layer 114 may be formed using, for example, a spin-on process.

A traditional organic chemically amplified resist (CAR) is unlikely to be used for high volume manufacturing with EUV lithography, despite their success in manufacturing with DUV lithography. The atoms in organic resists (C, H, O, and N) have low capture cross-section for EUV photons, resulting in low sensitivity of the CAR to EUV radiation. Additionally, as known to persons skilled in the art, the tradeoff between resolution and LER and sensitivity (RLS), characteristic of an organic CAR, limits its RLS metric. The scaling trend toward thinner resist is also likely an insurmountable hurdle. Structural stability at high aspect ratios places an upper bound on resist thickness, and masking ability places a lower bound on resist thickness. The low mechanical strength and low etch resistance of organic CAR leave practically no usable window for resist thickness in the sub-10 nm nodes, where the minimum pitch is 30 nm or lower.

On the other hand, MBR is a class of hybrid organic-inorganic resist that is promising. The MBR has a molecular structure comprising peripheral organic ligands attached to an inorganic core. The core comprises a metal nanoparticle or a metal-oxo nanocluster. Generally, metal atoms have a much higher capture cross-section for EUV photons. By incorporating metal, the MBR provides higher sensitivity to EUV radiation, higher etch resistance, and higher mechanical strength, hence better structural stability. Hence, MBR is preferred for EUV lithography. The first layer 114 may be an MBR having a metal-oxide core, such as an oxide of hafnium, zirconium, titanium, tin, zinc, indium, and aluminum. The photoresists in the examples in this disclosure (e.g., first layer 114) are tin-based resists. In one embodiment, the thickness of the tin-based resist first layer 114 is about 22 nm and, in various embodiments, the thickness may be between 15 nm and 35 nm. Tin-oxo nanoclusters are smaller and more uniformly distributed; hence, the tin-oxo nanocluster MBR may provide higher resolution and lower LER.

As illustrated in FIG. 1B, an underlayer 112 is disposed adjacent below the first layer 114. The underlayer 112 is typically used as a bottom antireflective coating (BARC) comprising a material selected to suppress undesired reflections and standing wave patterns due to interference between incident and reflected light. The underlayer 112 may comprise organic BARC, silicon-based antireflective coating (SiARC), spin-on glass (SOG), or a silicon carbide (SiC) layer, or the like. In some embodiment, the underlayer 112 may be formed using, for example, a spin-on process.

The lithography stack 110 may optionally include a hard mask layer 106 and a planarizing layer 108, as shown in the cross-sectional view illustrated in FIG. 1B.

The material for the hard mask layer 106 is selected to be resistant to etchants used to remove a portion of the layer to be patterned 104. In the example illustrated in FIG. 1B, where the layer to be-patterned 104 comprises TiN, the hard mask layer 106 may comprise tetraethyl orthosilicate (TEOS). In some embodiment, the layer to be-patterned 104 and the hard mask layer 106 may be formed using, for example, a chemical vapor deposition (CVD), a physical vapor deposition (PVD), or a plasma-enhanced CVD (PECVD) process.

In various embodiments, the planarizing layer 108 may be an organic planarizing layer (OPL) such as a $C_xH_y$ polymer or an amorphous carbon layer and may be formed using, for example, a spin-on process. Generally, the planarizing layer 108 has a sufficiently low viscosity so that the top surface of the planarizing layer 108 forms a substantially planar surface.

FIG. 1C illustrates a cross-sectional view of the semiconductor device 100 after the first layer 114 has been patterned using photolithography, for example, EUV lithography to form a first patterned layer 116. In this example, the first layer 114 being an MBR layer, the first patterned layer 116 is a patterned MBR layer. The first patterned layer 116 may be formed by exposing the first layer 114 to a pattern of actinic radiation which, in this example, is 13.5 nm EUV radiation. The exposed resist is then developed to form the first patterned layer 116. For specificity, in this example, the resist is a positive resist. Accordingly, the developer removes the exposed portions of the first layer 114, forming openings 115. In one embodiment, a thickness of the first patterned layer 116 may be about 9 nm (compared to the 22 nm thickness of the tin-based photoresist coated over the substrate to form the first layer 114). In various embodiments, the thickness of the first patterned layer 116 may be between 6 nm to 15 nm.

Densely packed features in a patterned layer (e.g., the first patterned layer 116) may have random bridging and line-break defects. A bridging defect is a defect where an expected separation between two closely spaced features (e.g., two adjacent lines) is bridged, for example, by random deviations in the edges of the two features. A line-break defect occurs if the continuity of a narrow feature (e.g., a narrow line) is broken, for example, because of random deviations in opposite edges of the feature. In selecting the process parameters (e.g., radiation exposure time) there is, naturally, a tradeoff between bridging and line-breaks. For example, in an array of lines drawn at a fixed pitch, increasing exposure time may reduce the probability for bridging but at a cost of increased probability for a line-break. Bridging of closely spaced lines may also be caused by resist residue or resist scum, such as the bridging defect 118 in the first patterned layer 116, illustrated in FIG. 1C. The process parameters may be optimized during process development to suppress line-breaks, and a descum/trim etch performed on the first patterned layer 116 to remove bridging defects and provide a process window for manufacturability.

FIG. 1D illustrates a cross-sectional view of the semiconductor device 100 after the first patterned layer 116 has been trimmed using a descumming etch process to form a second patterned layer 120 comprising trimmed resist lines 117 with a chemically adsorbed layer 122 on its surface, as explained in further detail below. The descumming etch process used in this example embodiment is a gaseous etch process comprising exposing the first patterned layer 116 to a gas comprising a gaseous halogen compound, typically diluted with an inert diluent gas. In one embodiment, the halogen compound is hydrogen bromide (HBr). In other embodiments, the halogen compound may be $BCl_3$, $Cl_2$, $I_2$, $F_2$, or HF. In one embodiment, the HBr gas is diluted with argon (Ar). In some other embodiment, the diluent may be some other inert gas, such as helium or nitrogen, or a combination of inert gases.

The gaseous etch process may be performed by loading the substrate in a processing chamber and flowing the gaseous mixture comprising the process gas (i.e., the halogen compound) and the diluent (i.e., the inert gas) over the substrate and through the chamber for a selected process duration. Flowing the gas exposes the first patterned layer 116 to the halogen compound for the selected process duration. During the process duration the halogen compound may chemically interact with the metal of the first patterned layer 116. In one embodiment, where the first patterned layer 116 comprises MBR (e.g., a tin-based MBR) and the halogen compound is HBr, the chemical interaction forms volatile byproducts, including a volatile metal bromide, for example, a tin bromide ($SnBr_x$) that may be removed from the processing chamber with the gas flow. The chemical reaction removes resist scum (e.g., the bridging defect 118 in FIG. 1C) as well as a portion of the resist features, thereby trimming a linewidth of the features and forming the descummed second patterned layer 120, as illustrated in FIG. 1D. For example, a first linewidth of a resist line in the first patterned layer 116 would be reduced by this gaseous etch process to a second linewidth to form a narrower resist line at the same location in the second patterned layer 120. Accordingly, the descumming etch is also a trimming etch that may be utilized to adjust the resist linewidth to a smaller target CD.

The chemical interaction is a surface interaction, and it is noted that this surface treatment may additionally form the chemically adsorbed layer 122 on the surface of the MBR, as illustrated in FIG. 1D. This slows down the linewidth reduction rate. As described in further detail below, the linewidth reduction rate reduces monotonically with increasing process duration.

The descum/trim etch process exposes the first patterned layer 116 to an un-ionized gas that is in thermal equilibrium at a controlled ambient temperature in the chamber. In other words, the gas (e.g., the gaseous mixture of HBr and Ar) is not in an excited state with a non-equilibrium distribution of high energy particles. As explained above, an aggressive descum etch, for example, a plasma treatment, may damage the resist features because gas discharge plasma is a weakly ionized gas in a non-equilibrium state having a large number of high-energy particles. Gas discharge plasma is ignited by exciting gas that is initially in thermal equilibrium at the ambient temperature with electromagnetic fields to generate ensembles of energetic ions and radicals having equivalent temperatures that are generally more than an order of magnitude higher than the ambient temperature. Since a damaged resist layer may result in increased LER and line-break defects, the less aggressive gaseous etch process using the un-ionized gas is used in the example embodiments in this disclosure to trim the first patterned layer 116 to form the second patterned layer 120 comprising the trimmed resist features and the chemically adsorbed layer 122 formed over the surface of the MBR.

In some embodiments, prior to flowing the gas (e.g., the gaseous mixture of HBr process gas and Ar diluent), the substrate temperature is set at a selected ambient temperature greater than or equal to −10° C. and less than or equal to 60° C. and maintained constant during the descum/trim etch process. In experiments performed by the inventors, it has been observed that a lower LER is achieved for lines in the pattern etched by the first pattern-transfer etch using the second patterned layer 120 as the etch mask when the substrate temperature is lowered. It is noted that, typically, adsorption rate increases with reducing temperature. Thus, the observed effect of temperature on LER indicates that the adsorption layer helps smooth out the LER in the first patterned layer 116.

As mentioned above, the first patterned layer 116 is exposed to the gaseous mixture of HBr process gas and Ar diluent in a processing chamber for a selected process duration to form the second patterned layer 120, illustrated in FIG. 1D. In some embodiments, the processing chamber for the descum etch, which is a gaseous etch, may be a vapor phase reaction chamber. In some other embodiments, the substrate may be loaded in a plasma chamber and the gaseous etch process may be performed in the plasma chamber prior to igniting plasma. An advantage of using the plasma chamber is that a subsequent pattern-transfer etch may be performed in situ in the same plasma chamber if the pattern-transfer etch is a plasma process, for example, a reactive ion etch (RIE), where the second patterned layer 120 is the etch mask.

In one embodiment, the flow of the gaseous mixture of HBr process gas and Ar diluent is controlled at 50 sccm for HBr and 500 sccm for Ar, the pressure in the processing chamber is controlled at 50 mTorr, and the selected process duration is 10 s. In various embodiments, the selected flow rate of HBr may be between 8 sccm to 70 sccm and the selected flow rate of Ar may be between 300 sccm to 700 sccm, the pressure in the processing chamber is controlled between 10 mTorr and 1 Torr, and the selected process duration may be between 4 s and 15 s.

In FIG. 1E, the first pattern-transfer etch using the second patterned layer 120 as the etch mask has been performed to pattern the underlayer 112. The first pattern-transfer etch removes the exposed portions of the underlayer 112 to extend the openings 115 and expose a surface of the substrate adjacent below the underlayer 112. The etching process may be using, for example, an anisotropic RIE technique with a suitable etch chemistry. The etching has reduced the thickness of the MBR of the second patterned layer 120, as illustrated in FIG. 1E. However, the patterned underlayer 112 may now be used as a masking layer for a subsequent second pattern-transfer etch.

As explained above, the patterned underlayer 112 has an acceptably low defect density because of using an embodiment of the invented method, wherein a chemical surface treatment with un-ionized gas comprising a halogen compound is used as the gaseous etch process to trim the first patterned layer 116 and remove resist scum to form the second patterned layer 120. In various experiments performed by the inventors, different materials have been used in forming the underlayer 112, viz., SiARC, SOG, and SiC. It has been observed that the pattern quality of the patterned underlayer 112 (illustrated in FIG. 1E) is insensitive to the material used for the underlayer 112.

Figure 1F:
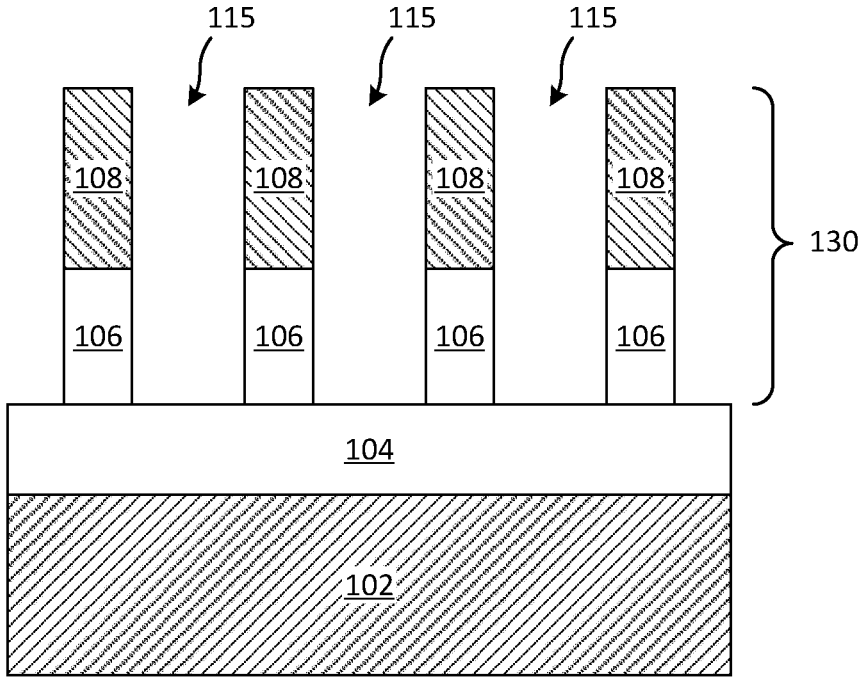

FIG. 1F illustrates a cross-sectional view of the semiconductor device 100 after the second pattern-transfer etch has been performed. As illustrated in FIG. 1F, the second pattern-transfer etch completes patterning the lithography stack 110 to form a patterned lithography stack 130. As illustrated in FIG. 1F, the second pattern-transfer etch removes the exposed portions of the planarizing layer 108 and hard mask layer 106 to extend the openings 115 and expose a surface of the layer to be patterned 104 disposed adjacent below a now patterned hard mask layer 106. Typically, there is no residual second patterned layer 120 comprising trimmed resist lines 117 with a chemically adsorbed layer 122 remaining over the substrate after the second pattern-transfer etch, as illustrated in FIG. 1F. Performing the second pattern-transfer etch may comprise performing a sequence of suitable etch steps with different etchants and process parameters, depending on the materials of the planarizing layer 108 and the hard mask layer 106. The underlayer 112 may be the etch mask during the second pattern-transfer etch. Depending on the material selectivity of the etch process, a major portion of the underlayer 112 and, even the entire underlayer 112 may be lost during the second pattern-transfer etch, as illustrated in FIG. 1F.

Figure 1G:
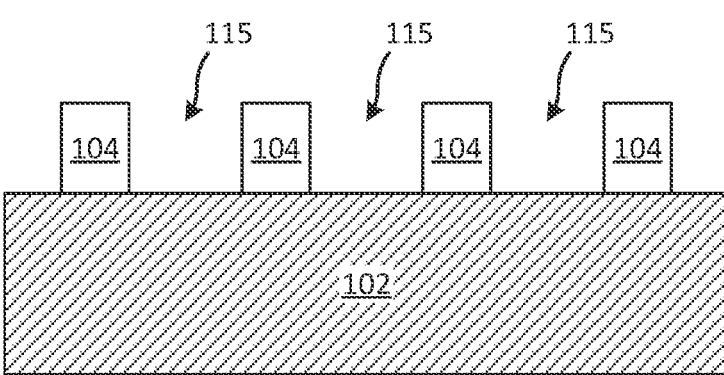

In FIG. 1G, the layer to be patterned 104 has been patterned using a third pattern-transfer etch using the patterned lithography stack 130 as an etch mask. In the example embodiment illustrated in FIG. 1G, the layer to be patterned 104 is a TiN layer. A suitable third pattern-transfer etch process is used to remove TiN from the exposed portions of the layer to be patterned 104. The third pattern-transfer etch process may comprise a plasma etch process using, for example, a chlorine chemistry to etch TiN. As illustrated in FIG. 1G, generally, any remaining portion of the lithography stack 130 comprising sacrificial layers is stripped from the substrate after the third pattern-transfer etch is completed. However, in some embodiments, the etch process may be adjusted to retain a thin layer of the hardmask layer 106 over the patterned lines of the layer to be patterned 104. For example, in an embodiment, where the layer to be patterned

104 comprises TiN and the hardmask layer 106 comprises TEOS, a thin layer of TEOS may be covering the top surface of the TiN lines.

In some embodiments, the first pattern-transfer etch, the second pattern-transfer etch, and the third pattern-transfer etch are performed in situ in a plasma chamber. In some other embodiments, where the descum/trim gaseous etch is performed in a plasma chamber, the descum/trim etch, the first pattern-transfer etch, the second pattern-transfer etch, and the third pattern-transfer etch may all be performed in situ in the same plasma chamber.

It is understood that that in some embodiments, the process flow described above (with reference to FIGS. 1A-1G) may include additional process steps. For example, prior to etching the underlayer 112 there may be a resist bake performed on the second patterned layer 120.

FIG. 2 illustrates a flowchart summarizing a process flow 200. The process flow 200 has been described above with reference to FIGS. 1A-1G. The incoming substrate has a layer to be patterned formed over a semiconductor substrate as indicated in box 210 (and FIG. 1A). In box 220 (and FIG. 1B) a lithography stack is formed over the layer to be patterned. Generally, a lithography stack comprises sacrificial layers. Using photolithography (e.g., EUV lithography), an MBR layer of the lithography stack may be patterned to form a first patterned layer, as indicated in box 230 (and FIG. 1C). The first patterned layer, may have resist scum that needs to be removed and features that may need trimming. In box 240 (and FIG. 1D), the descum/trim etch is performed to form a second patterned layer, which is the patterned MBR layer after descumming and trimming. The etch process is a chemical surface treatment with an un-ionized gas flow comprising a halogen compound (e.g., a gaseous mixture of HBr and Ar). As indicated in box 250 the second patterned layer is used as a masking layer to transfer the pattern to the lithography stack. A pattern-transfer etch is performed to pattern the underlayer (as shown in FIG. 1E). If the lithography stack includes optional planarization and/or hard mask layers then the patterned underlayer may be used as a masking layer to transfer the pattern to the rest of the lithography stack (as shown in FIG. 1F). The patterned lithography stack is used as an etch mask to transfer the pattern to the layer to be patterned, as indicated in box 260 (and in FIG. 1G). After the respective pattern-transfer etch is complete, the remaining portion of the lithography stack may be stripped, as indicated in box 270 (and seen in FIG. 1G).

Figure 3:
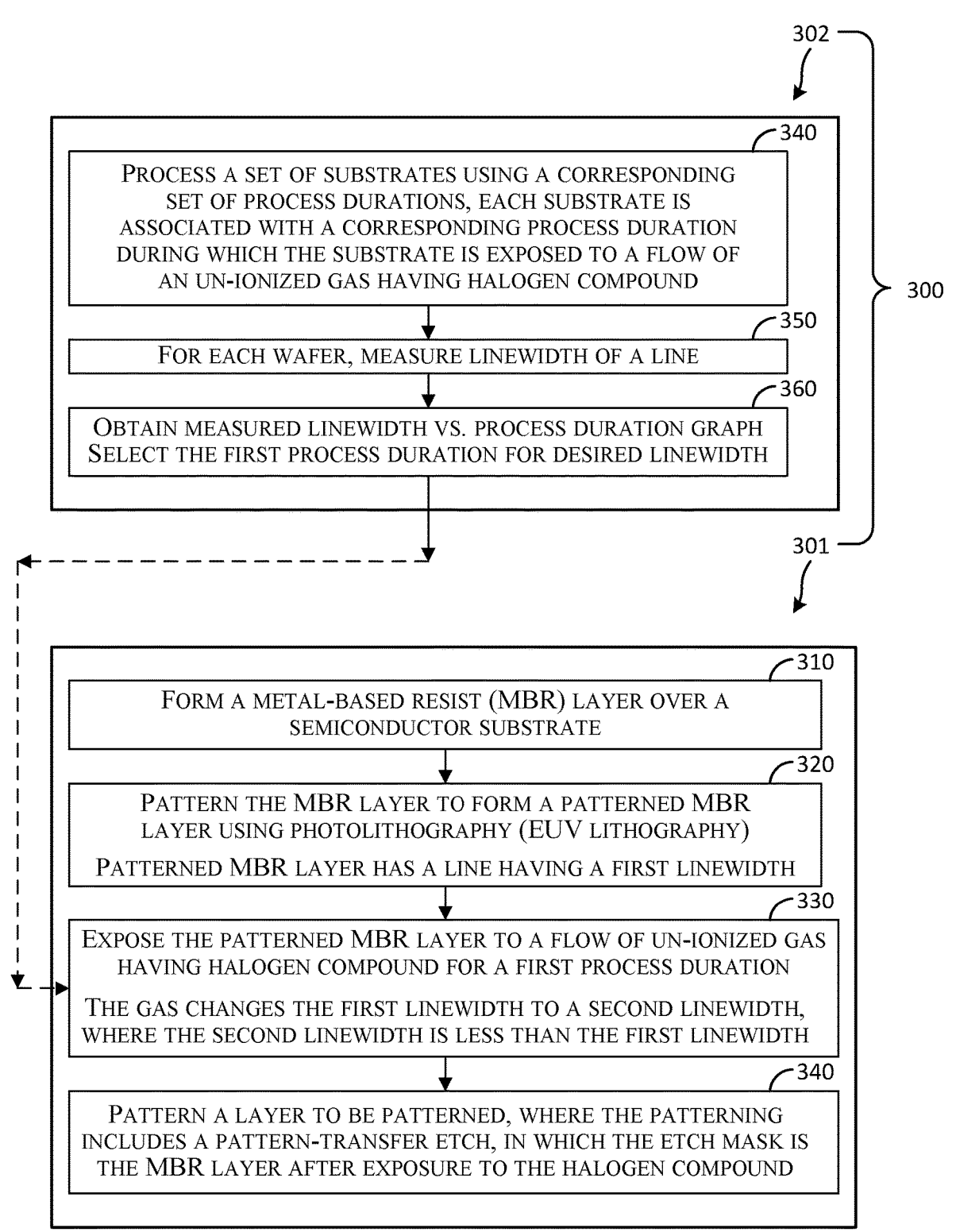
FIG. 3 illustrates a flowchart of a method of forming a semiconductor device, including a method of selecting a first process duration, prior to forming the semiconductor device, in accordance with some embodiment.

FIG. 3 illustrates a flowchart of a method 300 of forming a semiconductor device. The method 300 comprises executing a sequence 301 of process steps in a manufacturing process flow for fabricating a semiconductor device. Additionally, in the example method 300, prior to executing the sequence 301, a first process duration may be selected during process development using a method 302, as illustrated in the flowchart in FIG. 3. The first process duration is used subsequently to execute a process step (box 330) in the sequence of steps 301, as illustrated by dashed arrows in FIG. 3.

In the sequence 301, an MBR layer is formed (box 310), patterned (box 320), and the substrate exposed to a gas (box 330) for trimming patterned lines in the patterned MBR layer.

In box 310, the MBR layer is formed over a semiconductor substrate using, for example, a spin-on process. In the spin-on process, the substrate is rotated at a high rotational speed, a liquid MBR may be poured on a top surface of the spinning substrate, and distributed uniformly on the surface by centrifugal forces.

The MBR is a photosensitive material, selected to have a high absorption coefficient for EUV radiation, for example, a tin-oxo nanocluster hybrid organic-inorganic resist. As indicated in box 320, the MBR layer may be patterned by exposing it to a pattern of EUV radiation and developing the exposed MBR layer with a suitable developer to form the patterned MBR layer. The patterned MBR layer comprises a line having a first linewidth.

After forming the patterned MBR layer, a trimming etch (box 330) may be performed to change the linewidth of the line from the first linewidth to a second linewidth, the second linewidth being less than the first linewidth. The trimming etch is a gaseous etch process. The trimming is achieved by exposing the MBR layer to the gas for a fixed duration, which is the selected first process duration, selected a priori using the method 302, described in further detail below. The gas comprises a halogen compound that trims the patterned MBR layer and removes resist scum. As explained above, an aggressive trim/descum etch may result in increased LER and line-break defects during a subsequent pattern-transfer etch, in which the patterned MBR layer is the masking layer. Accordingly, the gas flow to which the substrate is exposed during the trim/descum etch comprises an un-ionized gas. The gas reacts chemically with the surface of the MBR in a self-limiting interaction that forms a chemically adsorbed layer on the surface.

As indicated in box 340, after completing exposing the substrate to the halogen compound in the un-ionized gas, the trimmed MBR layer may be used as an etch mask in a pattern transfer etch process to pattern other layers in the lithography stack and a layer to be patterned below the lithography stack. As explained above, the pattern-transfer may be achieved in several steps that may be using different etch chemistry, depending on the materials used in the lithography stack and the material used to form the layer to be patterned.

The process sequence 301 may be part of the manufacturing process flow for fabricating a semiconductor device. Since the first process duration may be used in a process step of the manufacturing flow (viz., box 330 in the sequence 301), the first process duration is selected prior to manufacturing, i.e., during process development, using the method 302. Once the first process duration is selected the semiconductor device may be fabricated in high volume manufacturing using the manufacturing process flow comprising the process sequence 301.

Generally, process development comprises performing several experiments, where each experiment processes a group of test substrates associated with a different process condition. In this context, a process condition means a set of values selected for the factors that are being varied from one experiment to another using, for example, a design of experiments (DOE) method. Varying the factors may affect observable metrics of the results of the processing. Measurements are made on the test substrates to evaluate the metrics and obtain response functions for the metrics in terms of the factors. The response functions are then used to select a process condition that provides a manufacturable process. For example, the inventors have processed test substrates using the sequence 301 of process steps, where they have varied the underlayer material and several process parameters for the descum/trim etch process. In addition, for each underlayer material, a reference substrate has been included, where the descum/trim etch step is skipped. The process parameters for the descum/trim etch process that were varied include process duration, HBr flow rate, Ar flow rate, substrate temperature, and gas pressure. The measured metrics are an average linewidth and LER of a line in a dense array of lines drawn at a fixed pitch that may be the minimum pitch allowed by the design rules. Measurements may be made on the pattern on the substrate at different points in the sequence of process steps. In one embodiment, measurements are made at two points in the process flow. A first measurement is made at a post-develop inspection done immediately after the patterned MBR layer is formed (box 320). A second measurement is done at a post-etch inspection done after patterning a layer to be patterned (box 340), where the patterning includes a pattern-transfer etch, in which the etch mask is the trimmed MBR layer formed after exposing the MBR layer to the gas comprising the halogen compound (box 330) is complete.

As indicated in the flowchart illustrated in FIG. 3, the method 302 comprises performing an experiment during process development, where a set of substrates is processed through a process sequence similar to the process sequence 301. In processing the set of substrates, a corresponding set of process durations is used during the trim/descum etch. Each substrate of the set of substrates is associated with a process duration of the set of process durations. The different process durations result in the line in the patterned and trimmed MBR layer to have different linewidths (i.e., different second linewidths) in different substrates. The second linewidth on each wafer is measured and the measured second linewidths plotted vs. the corresponding process durations to obtain a graph of linewidth vs. process duration.

As explained above, because of the self-limiting nature of the chemical interaction and the formation of the chemically adsorbed layer, the linewidth vs. process duration graph is observed to have a turning point with a process duration at which the linewidth goes through a minimum value. In other words, the linewidth initially decreases with increasing process duration but, for longer process durations the linewidth may go through a minimum value and start to increase. The linewidth vs. process duration graph obtained from the measurements is used to select the first process duration to produce a desired linewidth. It is noted that if the selected first process duration is in the neighborhood of the turning point then the process would be centered in a region of the graph where the linewidth is insensitive to process duration. This provides an advantage of reduced linewidth variation during manufacturing.

The embodiments described above in this disclosure are suitable for patterning a substrate to produce patterns having low LER. The methods have been demonstrated by the inventors by patterning test substrates using metal-based photoresist and EUV lithography to form line and space arrays at a dense pitch in the range of about 24 nm to 30 nm.

Example 1. A method of forming a semiconductor device, where the method includes receiving a substrate in a processing chamber, the substrate including a first patterned layer including a metal-based material; and with a gaseous etch process, trimming the first patterned layer to form a second patterned layer, the gaseous etch process including exposing the first patterned layer to an un-ionized gas including a halogen compound.

Example 2. The method of example 1, further including: prior to forming the first layer, forming an underlayer over the substrate; and using the second patterned layer as an etch mask, etching an underlayer to form a third patterned layer.

Example 3. The method of one of examples 1 or 2, where first patterned layer comprises an array of lines designed to have a pitch that is a minimum pitch for a photolithography process used in forming the first patterned layer.

Example 4. The method of one of examples 1 to 3, where the first patterned layer is a metal-based resist (MBR).

Example 5. The method of one of examples 1 to 4, where the gaseous etch process is a descum process, the descum process reducing a count of resist residue defects.

Example 6. The method of one of examples 1 to 5, where the first patterned layer is a tin-based resist.

Example 7. The method of one of examples 1 to 6, where the first patterned layer has been formed using an extreme ultraviolet (EUV) lithography process.

Example 8. The method of one of examples 1 to 7, where the halogen compound is hydrogen bromide.

Example 9. The method of one of examples 1 to 8, where exposing the first patterned layer to a gas including a halogen compound includes: flowing the gas including the halogen compound through the processing chamber; and exposing the first patterned layer to the halogen compound for a selected process duration.

Example 10. A method of patterning a semiconductor substrate, where the method includes receiving a substrate in a processing chamber, the substrate including a lithography stack over a layer to be patterned, the stack including a patterned metal based resist (MBR) layer and an underlayer below the MBR layer; and flowing an un-ionized gas over the substrate, the gas including a halogen compound, where flowing the gas causes the MBR layer to chemically react with the halogen compound.

Example 11. The method of example 10, further including: prior to flowing the gas, setting a temperature of the substrate at a selected ambient temperature, the selected ambient temperature being greater than or equal to −10° C. and less than or equal to 60° C.; and controlling the temperature of the substrate during flowing the gas.

Example 12. The method of one of examples 10 or 11, where the halogen compound is hydrogen bromide.

Example 13. The method of one of examples 10 to 12, where the underlayer includes a silicon-based antireflective coating (SiARC), spin-on glass (SOG), or silicon carbide.

Example 14. The method of one of examples 10 to 13, where the lithography stack includes a planarizing layer below the underlayer, the planarizing layer including an organic planarizing layer (OPL) or an amorphous carbon layer.

Example 15. The method of one of examples 10 to 14, where the lithography stack includes a hard mask layer disposed between the underlayer and the layer to be patterned.

Example 16. The method of one of examples 10 to 15, further including: after flowing the gas over the substrate, patterning the lithography stack to form a patterned lithography stack, the patterning the lithography stack including: performing a pattern-transfer etch process using the patterned MBR layer as an etch mask, the pattern-transfer etch process transferring the pattern of the patterned MBR layer to the lithography stack; and after patterning the lithography stack, patterning the layer to be patterned, where the patterning the layer to be patterned includes performing a pattern-transfer etch process using the patterned lithography stack as an etch mask.

Example 17. A method of forming a semiconductor device, where the method includes forming a metal-based resist (MBR) layer over a semiconductor substrate; patterning the MBR layer using a photolithography process to form a patterned MBR layer, the patterned MBR layer including a line having a first linewidth; exposing the patterned MBR layer to a flow of an un-ionized gas including a halogen compound to change the linewidth of the line from the first linewidth to a second linewidth, the second linewidth being less than the first linewidth; and after exposing the patterned MBR layer to a flow of an un-ionized gas including a halogen compound, patterning a layer to be patterned, where the patterning the layer to be patterned includes performing a pattern-transfer etch process using the patterned MBR layer as an etch mask.

Example 18. The method of example 17, where the halogen compound is hydrogen bromide.

Example 19. The method of one of examples 17 or 18, where the exposing includes exposing the patterned MBR layer to the flow of the un-ionized gas for a first process duration and, where the method further includes: prior to forming the semiconductor device, obtaining a linewidth vs. process duration graph, the obtaining including: processing a set of substrates using a corresponding set of process durations, each substrate being associated with a corresponding process duration; for each substrate, measuring a linewidth of a line; and plotting the set of measured linewidths and corresponding process duration to obtain the linewidth vs. process duration graph; and selecting the first process duration from the obtained linewidth vs. process duration graph, the first process duration being selected to produce a desired linewidth in the linewidth vs. process duration graph.

Example 20. The method of one of examples 17 to 19, where exposing the patterned MBR layer to a flow of an un-ionized gas forms a chemically adsorbed layer on the surface of the patterned MBR layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
 receiving a substrate in a processing chamber, the substrate comprising a first patterned layer comprising a metal-based material; and
 with a gaseous etch process using a plasma-free un-ionized gas mixture, trimming the first patterned layer to form a second patterned layer, the gaseous etch process comprising flowing the plasma-free un-ionized gas mixture through the processing chamber to trim the first patterned layer, the plasma-free un-ionized gas mixture comprising a single process gas and an inert gas diluent, the single process gas comprising a halogen compound.

2. The method of claim 1, further comprising:
 prior to forming the first patterned layer, forming an underlayer over the substrate; and
 using the second patterned layer as an etch mask, etching the underlayer to form a third patterned layer.

3. The method of claim 2, wherein the first patterned layer comprises an array of lines designed to have a pitch that is a minimum pitch for a photolithography process used in forming the first patterned layer.

4. The method of claim 1, wherein the first patterned layer is a metal-based resist (MBR).

5. The method of claim 4, wherein the gaseous etch process is a descum process, the descum process reducing a count of resist residue defects.

6. The method of claim 1, wherein the first patterned layer is a tin-based resist.

7. The method of claim 1, wherein the first patterned layer has been formed using an extreme ultraviolet (EUV) lithography process.

8. The method of claim 1, wherein the halogen compound is hydrogen bromide.

9. The method of claim 1, wherein flowing the plasma-free un-ionized gas mixture through the processing chamber to trim the first patterned layer comprises exposing the first patterned layer to the plasma-free un-ionized gas mixture for a selected process duration.

10. A method of patterning a semiconductor substrate, the method comprising:

receiving a substrate in a processing chamber, the substrate comprising a lithography stack over a layer to be patterned, the lithography stack comprising a patterned metal-based resist (MBR) layer and an underlayer below the patterned MBR layer; and flowing, using a plasma-free process, an un-ionized gas mixture over the substrate, the un-ionized gas mixture comprising a halogen compound and an inert gas diluent, wherein a flow rate of the inert gas diluent is at least 4 times a flow rate of the halogen compound, wherein flowing the un-ionized gas mixture causes the patterned MBR layer to chemically react with the halogen compound.

11. The method of claim 10, further comprising:

prior to flowing the un-ionized gas mixture over the substrate, setting a temperature of the substrate at a selected ambient temperature, the selected ambient temperature being greater than or equal to −10° C. and less than or equal to 60° C.; and controlling the temperature of the substrate during flowing the un-ionized gas mixture.

12. The method of claim 10, wherein the halogen compound is hydrogen bromide.

13. The method of claim 10, wherein the underlayer comprises a silicon-based antireflective coating (SiARC), spin-on glass (SOG), or silicon carbide.

14. The method of claim 10, wherein the lithography stack comprises a planarizing layer below the underlayer, the planarizing layer comprising an organic planarizing layer (OPL) or an amorphous carbon layer.

15. The method of claim 10, wherein the lithography stack comprises a hard mask layer disposed between the underlayer and the layer to be patterned.

16. The method of claim 10, further comprising:

after flowing the un-ionized gas mixture over the substrate, patterning the lithography stack to form a patterned lithography stack, wherein patterning the lithography stack comprises:

performing a pattern-transfer etch process using the patterned MBR layer as an etch mask, the pattern-transfer etch process transferring the pattern of the patterned MBR layer to the lithography stack; and after patterning the lithography stack, patterning the layer to be patterned, wherein patterning the layer to be patterned comprises performing a pattern-transfer etch process using the patterned lithography stack as an etch mask.

17. A method of forming a semiconductor device, the method comprising:

forming a metal-based resist (MBR) layer over a semiconductor substrate;

patterning the MBR layer using a photolithography process to form a patterned MBR layer, the patterned MBR layer comprising a line having a first linewidth;

exposing, using a plasma-free process, the patterned MBR layer to a flow of an un-ionized gas mixture to change the linewidth of the line from the first linewidth to a second linewidth, the second linewidth being less than the first linewidth, the un-ionized gas mixture comprising a single process gas and an inert gas diluent, the single process gas comprising a halogen compound; and after exposing the patterned MBR layer to the flow of the un-ionized gas mixture, patterning a layer to be patterned, wherein the patterning the layer to be patterned comprises performing a pattern-transfer etch process using the patterned MBR layer as an etch mask.

18. The method of claim 17, wherein the halogen compound is hydrogen bromide.

19. The method of claim 17, wherein the exposing comprises exposing the patterned MBR layer to the flow of the un-ionized gas mixture for a first process duration, and wherein the method further comprises:

prior to forming the semiconductor device, obtaining a linewidth vs. process duration graph, the obtaining comprising:

processing a set of substrates using a corresponding set of process durations, each substrate being associated with a corresponding process duration;

for each substrate, measuring a linewidth of a line to obtain a set of measured linewidths; and plotting the set of measured linewidths against the corresponding set of process durations to obtain the linewidth vs. process duration graph; and selecting the first process duration from the obtained linewidth vs. process duration graph, the first process duration being selected to produce a desired linewidth in the linewidth vs. process duration graph.

20. The method of claim 17, wherein exposing the patterned MBR layer to the flow of the un-ionized gas mixture forms a chemically adsorbed layer on a surface of the patterned MBR layer.

21. The method of claim 1, wherein the first patterned layer comprises a line having a first linewidth, the trimming changing the linewidth of the line from the first linewidth to a second linewidth, the second linewidth being less than the first linewidth.

* * * * *